(12) United States Patent
Döllgast et al.

(10) Patent No.: US 11,476,407 B2
(45) Date of Patent: Oct. 18, 2022

(54) METHOD FOR PRODUCING A PIEZOELECTRIC TRANSFORMER AND PIEZOELECTRIC TRANSFORMER

(71) Applicant: EPCOS AG, Munich (DE)

(72) Inventors: Bernhard Döllgast, Deutschlandsberg (AT); Markus Puff, Graz (AT); Pavol Kudela, Deutschlandsberg (AT); Michael Weilguni, Hagenberg (AT)

(73) Assignee: EPCOS AG, Munich (DE)

( * ) Notice: Subject to any disclaimer, the term of this patent is extended or adjusted under 35 U.S.C. 154(b) by 1030 days.

(21) Appl. No.: 16/077,424

(22) PCT Filed: Jan. 10, 2017

(86) PCT No.: PCT/EP2017/050412
§ 371 (c)(1),
(2) Date: Aug. 10, 2018

(87) PCT Pub. No.: WO2017/137195
PCT Pub. Date: Aug. 17, 2017

(65) Prior Publication Data
US 2019/0051813 A1 Feb. 14, 2019

(30) Foreign Application Priority Data
Feb. 12, 2016 (DE) .......................... 102016102488.0

(51) Int. Cl.
*H01L 41/107* (2006.01)
*H01L 41/257* (2013.01)
(Continued)

(52) U.S. Cl.
CPC ............ *H01L 41/107* (2013.01); *H01L 22/12* (2013.01); *H01L 41/257* (2013.01); *H05H 1/2475* (2013.01); *H05H 1/2481* (2021.05)

(58) Field of Classification Search
CPC ..... H01L 41/107; H01L 41/257; H01L 22/12; H05H 1/2475; H05H 1/2481
(Continued)

(56) References Cited

U.S. PATENT DOCUMENTS 3,766,615 A   10/1973   Shimizu
3,945,099 A   3/1976   Kansy
(Continued)

FOREIGN PATENT DOCUMENTS

DE   102013100617 A1   7/2014
DE   102014110405 A    1/2016
(Continued)

*Primary Examiner* — Shawki S Ismail
*Assistant Examiner* — Monica Mata
(74) *Attorney, Agent, or Firm* — Slater Matsil, LLP

(57) ABSTRACT

A piezoelectric transformer and a method for producing a piezoelectric transformer are disclosed. In an embodiment, the method includes manufacturing a main body having an input region having electrodes and a first piezoelectric material being alternately stacked one on top of the other. An output region includes a second piezoelectric material. The first piezoelectric material is polarized and a removable contact is fitted to an output-side end side of the main body, which end side faces away from the input region. A first electrical potential is applied to the removable contact for polarizing the second piezoelectric material.

13 Claims, 2 Drawing Sheets

(51) Int. Cl.
*H01L 21/66* (2006.01)
*H05H 1/24* (2006.01)

(58) Field of Classification Search
USPC .......................................................... 310/359
See application file for complete search history.

(56) References Cited

U.S. PATENT DOCUMENTS

| | | | |
|---|---|---|---|
| 5,440,195 A | 8/1995 | Ohnishi et al. | |
| 5,959,391 A | 9/1999 | Ogiso et al. | |
| 6,051,915 A | 4/2000 | Katsuno et al. | |
| 9,788,404 B2 | 10/2017 | Nettesheim et al. | |
| 2004/0000846 A1 | 1/2004 | Hsu et al. | |
| 2009/0122941 A1 | 5/2009 | Engemann et al. | |
| 2015/0287903 A1* | 10/2015 | Jeong | H01L 41/107 310/339 |
| 2015/0373824 A1* | 12/2015 | Nettesheim | H01L 41/053 315/111.21 |
| 2017/0208657 A1 | 7/2017 | Doellgast et al. | |

FOREIGN PATENT DOCUMENTS

| | | |
|---|---|---|
| EP | 0794580 A1 | 9/1997 |
| JP | H06224484 A | 8/1994 |
| JP | H0974235 A | 3/1997 |
| JP | H10051043 | 2/1998 |
| JP | 2000094849 A | 4/2000 |
| JP | 2000294849 A | 10/2000 |
| JP | 2009501409 A | 1/2009 |
| JP | 4984389 B2 | 7/2012 |
| JP | 2015076420 A | 4/2015 |
| WO | 9729521 A1 | 8/1997 |
| WO | 2007006298 A2 | 1/2007 |

* cited by examiner

METHOD FOR PRODUCING A PIEZOELECTRIC TRANSFORMER AND PIEZOELECTRIC TRANSFORMER

This patent application is a national phase filing under section 371 of PCT/EP2017/050412, filed Jan. 10, 2017, which claims the priority of German patent application 10 2016 102 488.0, filed Feb. 12, 2016, each of which is incorporated herein by reference in its entirety.

TECHNICAL FIELD

The present invention relates to a method for producing a piezoelectric transformer and also to a piezoelectric transformer.

BACKGROUND

A piezoelectric transformer can be used in an apparatus for generating a non-thermal atmospheric pressure plasma.

The use of piezoelectric transformers, in particular Rosen-type transformers, for generating non-thermal atmospheric pressure plasma is known. Considerable difficulties are caused during production as a result of a polarization of a piezoelectric material in the output region of the piezoelectric transformer usually being performed by an electrical potential being applied to a metallization which is applied to the output-side end side.

However, the application of a metallization to the output-side end side is difficult from a manufacturing point of view in piezoelectric transformers which have a considerably greater extent in a longitudinal direction than in spatial directions which are perpendicular to the longitudinal direction. Two machines are often required for applying the metallization in order to be able to take into account the dimensional differences of the piezoelectric component. In addition, the component has to be firmly held in order to be able to treat the end side separately from the other side faces of the component. On account of the dimensions of the transformer, this firm holding is not simple either.

A further disadvantage of the metallization which is applied to the output-side end side is that, when the piezoelectric transformer is used for plasma generation, the output-side end side is subjected to considerable stresses as a result of changes in temperature and the occurring chemical processes during plasma generation. The metallization which is applied to the output-side end side can be damaged by these stresses, as a result of which the piezoelectric transformer may be destroyed.

SUMMARY OF THE INVENTION

Embodiments provide an improved production method for producing a piezoelectric transformer. Further embodiments provide an improved piezoelectric transformer.

Embodiments of the invention propose a method for producing a piezoelectric transformer. The method comprises the following steps: a) manufacturing a main body having an input region, in which electrodes and a first piezoelectric material are alternately stacked one on top of the other, and an output region which has a second piezoelectric material, b) polarizing the first piezoelectric material, c) fitting a removable contact to an output-side end side of the main body, which end side faces away from the input region, and applying a first electrical potential to the removable contact for polarizing the second piezoelectric material, wherein steps b) and c) are carried out in any desired order.

A metallization of the output-side end side can be dispensed with owing to the use of a removable contact in step c). The use of the removable contact, which, for example, can be pressed on as a flexible contact element or which can be applied as a temporarily applied layer, is associated with substantially less expenditure from a manufacturing point of view than the application of a metallization to the output-side end side, which metallization remains on the end side permanently. Accordingly, in particular, step c) leads to a simple production method.

In addition, a piezoelectric transformer of which the output-side end side is free of a metallization can be manufactured in this way. Accordingly, the output-side end side is less susceptible to damage due to changes in temperature or chemical processes during the plasma generation during operation of the piezoelectric transformer. As a result, the method facilitates the manufacture of a piezoelectric transformer which has a particularly long service life since it is less sensitive to damage due to changes in temperature or chemical processes during the plasma generation.

The output-side end side can be rectangular, wherein the output-side end side has, for example, side lengths of 3 mm and 6 mm. The piezoelectric transformer can further have a length of 70 mm in a longitudinal direction.

The input region can have two outer electrodes, wherein the electrodes, in the input region, are respectively connected to one of the outer electrodes. For polarizing the second piezoelectric material, a second electrical potential can be applied to the two outer electrodes, so that a voltage is applied between the electrodes of the input region and the removable contact. The second piezoelectric material can be polarized by the voltage. Accordingly, for polarizing the second piezoelectric material, there is no need to fit any elements to the piezoelectric transformer which remain on the transformer permanently and do not have any function during operation of the transformer.

After completion of step c), the removable contact can be removed.

The removable contact can be fitted by a contact element being pressed against the end side. Owing to the pressing, it is possible to ensure that the contact element is well matched to the shape of the output-side end side and fits flush against the end side. Therefore, it is possible to ensure that an electrical potential is effectively transmitted from the contact element to the output-side end side.

The removable contact can have a flexible metal structure. The metal structure can be, for example, a metal lattice. When the contact is pressed against the output-side end side, the metal structure can in the process deform in such a way that it assumes the shape of the output-side end side. Furthermore, metal is highly suitable because it is temperature-resistant and heat which occurs during polarization of the second piezoelectric material does not lead to damage to the flexible metal structure.

The removable contact can have a layer which has a conductive polymer and/or a rubber which is filled with conductive particles. The rubber may be a silicone. The layer can be combined with the flexible metal structure to form a contact.

Furthermore, the removable contact can be fitted by a conductive layer being temporarily applied to the output-side end side, which conductive layer is removed after the polarization of the second piezoelectric material. A layer which is applied only temporarily can be applied with considerably less expenditure on manufacture than would be the case for a metallization of the output-side end side which would remain on the end side permanently.

The method can further comprise step d). In step d), an impedance and/or a capacitance of the piezoelectric transformer can be measured, wherein a third potential is applied to the output-side end side by means of a removable contact in this step. In the process, a fourth potential can be applied to the electrodes of the input region by means of the outer electrodes. The capacitance and/or the impedance can be ascertained for the input region and the output region in separate sub-steps of step d). This step facilitates quality control with which it is possible to ensure that the polarization which is carried out beforehand is sufficient.

A further aspect of the present invention relates to a piezoelectric transformer. The piezoelectric transformer can be manufactured, in particular, by the above-described production method. The piezoelectric transformer has a main body with an input region, in which electrodes and a first piezoelectric material are alternately stacked one on top of the other, and an output region which has a second piezoelectric material. The main body has an output-side end side which faces away from the input region and which is free of a metallization.

The piezoelectric transformer can be provided, in particular, for generating non-thermal atmospheric pressure plasma. A metallization of the output-side end side can be used as a working electrode in a transformer which has the task of generating a high voltage which is tapped off by a downstream circuit. However, the plasma generation can also be generated by dielectric barrier discharge during which a sufficiently high electrical potential is generated on the output-side end side. Accordingly, no metallization of the output-side end side is required for plasma generation.

As described above, the metallization of the output-side end side is not required for polarizing the second piezoelectric material either.

If a metallization of the output-side end side is dispensed with, the output-side end side is less sensitive to damage due to fluctuations in temperature or chemical processes during the plasma generation.

The surface of the output-side end side can be composed of a second piezoelectric material. The ceramic material is resistant to thermal and chemical attacks.

According to a further aspect of the present invention, the invention relates to an apparatus for generating a non-thermal atmospheric pressure plasma, which apparatus has a piezoelectric transformer. The piezoelectric transformer is the above-described transformer in this case.

BRIEF DESCRIPTION OF THE DRAWINGS

The present invention will be described in more detail below with reference to the drawings.

DETAILED DESCRIPTION OF ILLUSTRATIVE EMBODIMENTS

Figure 1:
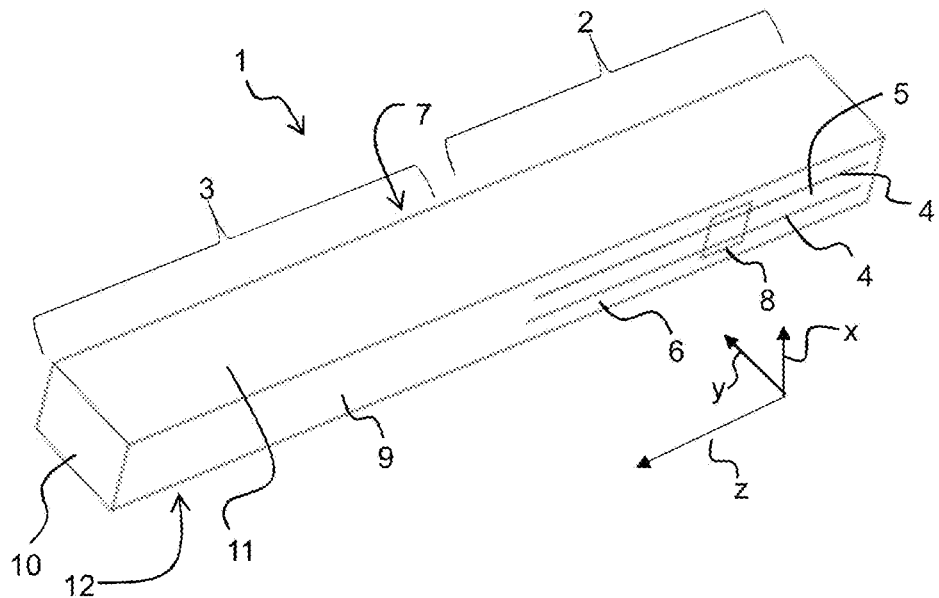
FIG. 1 shows a perspective view of a piezoelectric transformer.

FIG. 1 shows a perspective view of a piezoelectric transformer 1. The piezoelectric transformer 1 can be used, in particular, in an apparatus for generating non-thermal atmospheric pressure plasma.

A piezoelectric transformer 1 is a type of resonance transformer which is based on piezoelectricity and, in contrast to conventional magnetic transformers, constitutes an electromechanical system. The piezoelectric transformer 1 is, for example, a Rosen-type transformer.

The piezoelectric transformer 1 has an input region 2 and an output region 3, wherein the output region 3 adjoins the input region 2 in a longitudinal direction z. In the input region 2, the piezoelectric transformer 1 has electrodes 4 to which an AC voltage can be applied. The electrodes 4 extend in the longitudinal direction z of the piezoelectric transformer 1. The electrodes 4 are alternately stacked with a first piezoelectric material 5 in a stacking direction x which is perpendicular to the longitudinal direction z. The first piezoelectric material 5 is polarized in the stacking direction x in this case.

The electrodes 4 are arranged in the interior of the piezoelectric transformer 1 and are also called inner electrodes. The piezoelectric transformer 1 has a first side face 6 and a second side face 7 which is situated opposite the first side face 6. A first outer electrode 8 is arranged on the first side face 6. A second outer electrode (not shown) is arranged on the second side face 7. The internal electrodes 4 are alternately electrically contacted either by the first outer electrode 8 or the second outer electrode in stacking direction x.

Furthermore, the piezoelectric transformer 1 has a third side face 11 and a fourth side face 12, which side faces are situated opposite one another and are arranged perpendicular to the first side face 6 and the second side face 7. The surface normals of the third and of the fourth side faces 11, 12 each point in the stacking direction x.

The input region 2 can be actuated with a low AC voltage which is applied between the electrodes 4. On account of the piezoelectric effect, the AC voltage which is applied on the input side is initially converted into a mechanical oscillation. The frequency of the mechanical oscillation is substantially dependent on the geometry and the mechanical structure of the piezoelectric transformer 1 in this case.

The output region 3 has a second piezoelectric material 9 and is free of internal electrodes. The second piezoelectric material 9 in the output region is polarized in the longitudinal direction z. The second piezoelectric material 9 of the output region 3 can be the same material as in the first piezoelectric material 5 of the input region 2, wherein the two piezoelectric materials 5 and 9 can differ in respect of their polarization direction. In a preferred embodiment, the second piezoelectric material 9 in the output region 3 is shaped to form a single monolithic layer which is fully polarized in the longitudinal direction z. In this case, the piezoelectric material 9 in the output region 3 has only one single polarization direction.

As an alternative, the second piezoelectric material 9 in the output region 3 can form a few layers which are each respectively polarized in opposite directions to one another, wherein the layers are polarized either in the positive longitudinal direction z or in the negative longitudinal direction −z.

If an AC voltage is applied to the electrodes 4 in the input region 2, a mechanical wave forms within the piezoelectric material 5, 9, the mechanical wave generating an output voltage in the output region 3 owing to the piezoelectric effect. The voltage transformation is determined by the thickness of the layers composed of piezoelectric material 5, 9 in the input region 2 and in the output region 3.

The output region 3 has an output-side end side 10. The electrical voltage which is generated in the output region 3 is therefore applied between the end side 10 and the end of the electrodes 4 of the input region 2. In this case, a very high potential is produced at the output-side end side 10. As a result, a high potential difference is also produced between the output-side end side 10 and an area surrounding the piezoelectric transformer, the potential difference sufficing to generate a strong electrical field that ionizes a process gas.

In this way, the piezoelectric transformer 1 generates high electric fields which are capable of ionizing gases or liquids by means of electrical excitation. This results in dielectric barrier discharge. In this case, atoms or molecules of the respective gas or of the respective liquid are ionized and form a plasma. Ionization occurs whenever the electric field strength at the surface of the piezoelectric transformer 1 exceeds the ignition field strength of the plasma. In this case, the term ignition field strength of a plasma indicates the field strength which is required for ionizing the atoms or molecules.

In the coordinate system illustrated in FIG. 1, a y direction is marked y, the y direction being perpendicular to the stacking direction x and perpendicular to the longitudinal direction z.

A method for producing the piezoelectric transformer shown in FIG. 1 will be described below. In so doing, in particular, the polarization of the first piezoelectric material in the input region and the polarization of the second piezoelectric material in the output region will be described in detail.

Figure 2:
FIG. 2 shows a diagram of the course of a method for producing the piezoelectric transformer.

FIG. 2 shows a diagram which explains the course of the production method.

In a first manufacturing step a), a main body of the piezoelectric transformer 1 is manufactured, the main body having the input region 2 and the output region 3. In this case, the input region 2 has, as already shown in FIG. 1, the electrodes 4 and a first piezoelectric material 5, wherein the electrodes 4 and the first piezoelectric material 5 are respectively alternately stacked one on top of the other in the stacking direction x. The output region 3 has the second piezoelectric material 9. After completion of step a), both the first piezoelectric material 5 in the input region 2 and also the second piezoelectric material 9 in the output region 3 are unpolarized.

In further steps b), c) of the production method, the piezoelectric materials 5, 9 in the input region 2 and in the output region 3 are polarized. The polarization of the input region 2 and the polarization of the output region 3 are performed in two separate steps b), c), wherein the order of these two steps b), c) is arbitrary.

The polarization of the input region 2 in a method step b) will be described first. An electrical potential is applied to the first outer electrode 8 and is therefore also applied to the electrodes 4 which are connected to the first outer electrode 8. An electrical potential which differs from the electrical potential is further applied to the second outer electrode and is therefore also applied to the electrodes 4 which are connected to the second outer electrode. Accordingly, an electrical voltage is now applied between the electrodes 4 which are alternately stacked one on top of the other in the input region 2. The first piezoelectric material 5 in the input region 2 is polarized by this voltage.

A method step c) will now be described, in which method step the second piezoelectric material 9 in the output region 3 is polarized. For polarizing the second piezoelectric material 9, a voltage is applied between the output-side end side 10 of the main body and the ends of the electrodes 4 of the input region 2 which point toward the output region 3. A first electrical potential is applied to the output-side end side 10 of the main body in this case. This first electrical potential is applied to the output-side end side 10 of the main body by means of a removable contact.

The removable electrical contact may be, for example, a contact element 13 which is pressed by an apparatus against the output-side end side 10 of the transformer 1. The contact element 13 is preferably of flexible and flat design in this case. As a result, it is possible for the contact element 13 to be matched to the shape of the output-side end side 10 and bear flush against the end side.

Figure 3:
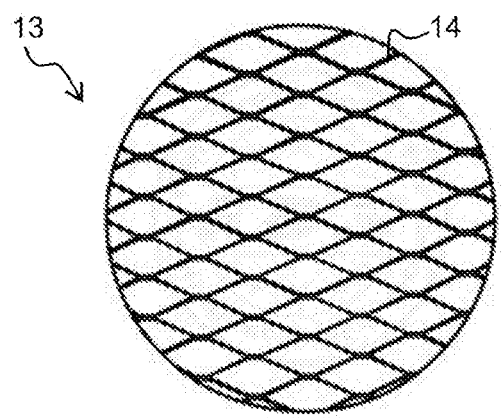
FIG. 3 shows a contact element according to a first exemplary embodiment.
Figure 4:
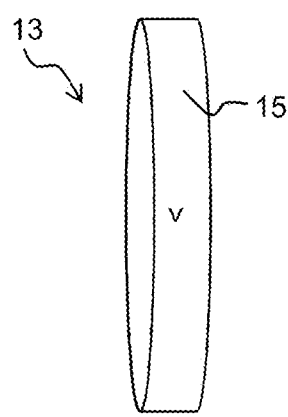
FIG. 4 shows a contact element according to a second exemplary embodiment.

FIGS. 3 and 4 show different exemplary embodiments of the contact element 13. By way of example, the contact element 13 can be a flexible metal lattice 14, as shown in FIG. 3. The contact element 13 may also be a layer 15 which has a conductive polymer. The layer 15 can be disk-shaped, for example.

In addition to the conductive polymer or as an alternative to the conductive polymer, the layer 15 can have a rubber which is filled with conductive particles or a silicone which is filled with conductive particles.

The contact elements 13 shown in FIGS. 3 and 4 are customary and are made commercially available, for example, for EMC shields (EMC=electromagnetic compatibility).

The removable contact should furthermore be temperature-resistant in order to not be damaged by heat which occurs during the polarization of the second piezoelectric material 9.

A second electrical potential is applied to the electrodes 4 of the input region 2. To this end, the first and the second outer electrode 8 can be short-circuited. In particular, the second electrical potential can be applied both to the first outer electrode 8 and also to the second outer electrode. Accordingly, the same potential is now applied to all of the electrodes 4 of the input region 2. An electrical voltage now forms between the output-side end side 10, to which the first electrical potential is applied by the removable contact, and the electrodes 4 of the input region 2. The second piezoelectric material 9 is polarized by this voltage.

At the end of the polarization step c), the removable contact is removed from the output-side end side 10 again. If the contact is a flexible contact element 13 which is pressed against the end side 10 by the apparatus, the contact pressure is now simply relaxed, so that the contact element 13 can be detached from the end side 10.

An alternative exemplary embodiment provides that the removable contact is formed on the output-side end side 10 by a temporarily applied layer. To this end, a temporarily provided cap can be applied by the piezoelectric transformer 1, by way of its output region 3, being dipped into a liquid bath which produces a conductive layer on the output-side end side 10. The conductive layer can have, for example, a conductive polymer and/or rubber which is filled with conductive particles. In step c), a first electrical potential can be applied to the conductive layer. If the second piezoelectric material 9 is polarized, the conductive cap can be removed from the piezoelectric transformer 1. To this end, the cap can be removed, for example, by a scraper.

After completion of steps b) and c), a further step d) can be carried out, the step facilitating quality control of the manufactured piezoelectric transformer 1. In step d), a capacitance and/or an impedance of the output region 3 and also a capacitance and/or an impedance of the input region 2 can be measured.

For measuring the capacitance and/or the inductance of the output region 3, a third electrical potential is in turn applied to the output-side end side 10 by means of a removable contact. A fourth electrical potential is respectively applied to the two outer electrodes 8 of the input region 2, so that all of the electrodes 4 of the input region 2 are at the same electrical potential. An electrical voltage is again formed between the output-side end side 10 and the electrodes 4 of the input region 2. The capacitance and/or the impedance of the input region 2 can now be measured. The measurement of these variables facilitates, in particular, checking in respect of whether polarization of the second piezoelectric material 5 has taken place to a sufficient extent.

In step d), the polarization of the first piezoelectric material 9 in the input region 2 can furthermore also be checked by an electrical potential being respectively applied to the first outer electrode 8 and to the second outer electrode.

The removable contact used in step d) may be the removable contact already used in step c).

As described here, an electrical potential is applied to the output-side end side 10 during the production method, without a metallization having to be applied to the output-side end side 10 for this purpose. Instead, the removable contact is used, which removable contact is removed from the transformer 1 again before conclusion of the method. Accordingly, the output-side end side 10 can be free of a metallization and, instead, composed of the second piezoelectric material 9.

The invention claimed is:

1. A method for producing a piezoelectric transformer, the method comprising:
   manufacturing a main body having an input region comprising first electrodes and a first piezoelectric material being alternately stacked one on top of the other, the main body also having an output region comprising a second piezoelectric material;
   polarizing the first piezoelectric material;
   fitting a removable contact to an output-side end side of the main body, the output-side end side facing away from the input region; and
   applying a first electrical potential to the removable contact for polarizing the second piezoelectric material.

2. The method according to claim 1,
   wherein the input region has two outer electrodes,
   wherein the first electrodes in the input region are respectively connected to one of the two outer electrodes, and
   wherein, for polarizing the second piezoelectric material, a second electrical potential is applied to the two outer electrodes so that a voltage is applied between the first electrodes of the input region and the output-side end side.

3. The method according to claim 1, further comprising removing the removable contact after fitting the removable contact to the output-side end side of the main body.

4. The method according to claim 1, wherein the removable contact is fitted by a contact element being pressed against the output-side end side.

5. The method according to claim 1, wherein the removable contact has a flexible metal structure.

6. The method according to claim 1, wherein the removable contact has a layer comprising a conductive polymer and/or a rubber that is filled with conductive particles.

7. The method according to claim 1, wherein the removable contact is fitted by a conductive layer being temporarily applied to the output-side end side, and wherein the conductive layer is removed after polarizing the second piezoelectric material.

8. The method according to claim 1, further comprising measuring an impedance and/or a capacitance of the piezoelectric transformer, wherein a third potential is applied to the output-side end side by a second removable contact.

9. The method according to claim 1, wherein the piezoelectric transformer is a transformer configured for generating non-thermal atmospheric pressure plasma.

10. A piezoelectric transformer comprising:
    a main body with an input region comprising electrodes and a first piezoelectric material being alternately stacked one on top of the other; and
    an output region comprising a second piezoelectric material,
    wherein the main body has an output-side end side that faces away from the input region and that is free of a metallization,
    wherein the output region comprises an upper surface, a lower surface and side surfaces, and
    wherein each of the upper surface, the lower surface and the side surfaces of the output region is completely free of the metallization such that no surface of the entire output region is covered by the metallization.

11. The piezoelectric transformer according to claim 10, wherein a surface of the output-side end side is composed of the second piezoelectric material.

12. The piezoelectric transformer according to claim 10, wherein the piezoelectric transformer is a transformer configured for generating non-thermal atmospheric pressure plasma.

13. An apparatus for generating a non-thermal atmospheric pressure plasma comprising:
    the piezoelectric transformer according to claim 10.

* * * * *